United States Patent
Udagawa et al.

(10) Patent No.: US 7,593,480 B2
(45) Date of Patent: Sep. 22, 2009

(54) TRANSMISSION DEVICE AND RADIO COMMUNICATION DEVICE

(75) Inventors: Masaharu Udagawa, Tokyo (JP);
Mamoru Arayashiki, Kanagawa (JP);
Yoshihiro Hara, Osaka (JP)

(73) Assignee: Panasonic Corporation, Osaka (JP)

( * ) Notice: Subject to any disclaimer, the term of this patent is extended or adjusted under 35 U.S.C. 154(b) by 519 days.

(21) Appl. No.: 10/598,695

(22) PCT Filed: Mar. 9, 2005

(86) PCT No.: PCT/JP2005/004127

§ 371 (c)(1),
(2), (4) Date: Sep. 8, 2006

(87) PCT Pub. No.: WO2005/088842

PCT Pub. Date: Sep. 22, 2005

(65) Prior Publication Data

US 2007/0183530 A1 Aug. 9, 2007

(30) Foreign Application Priority Data

Mar. 10, 2004 (JP) .............................. 2004-068003

(51) Int. Cl.
*H04K 1/02* (2006.01)
*H04L 25/03* (2006.01)
*H04L 25/49* (2006.01)
(52) U.S. Cl. ....................................... 375/297; 375/259
(58) Field of Classification Search ................. 375/219, 375/259, 268, 271, 295, 297, 300, 302; 332/145, 332/176
See application file for complete search history.

(56) References Cited

U.S. PATENT DOCUMENTS

| 5,506,546 | A | 4/1996 | Kowaguchi | |
|---|---|---|---|---|
| 5,847,602 | A | 12/1998 | Su | |
| 5,973,556 | A | 10/1999 | Su | |
| 6,256,482 | B1 | 7/2001 | Raab | |
| 6,323,731 | B1 | 11/2001 | McCune, Jr. | |
| 6,680,648 | B2 * | 1/2004 | Nguyen et al. | 330/149 |
| 6,813,319 | B1 | 11/2004 | Nagle et al. | |
| 7,068,984 | B2 * | 6/2006 | Mathe et al. | 455/126 |

(Continued)

FOREIGN PATENT DOCUMENTS

JP 7-170202 7/1995

(Continued)

OTHER PUBLICATIONS

English Language Abstract of JP 10-256843., Sep. 25, 1998.
English Language Abstract of JP 2001-156554., Aug. 6, 2001.

*Primary Examiner*—Jean B Corrielus
(74) *Attorney, Agent, or Firm*—Greenblum & Bernstein P.L.C.

(57) ABSTRACT

A transmission device having a preferable power efficiency and a wide control range of transmission output power. A pre-stage side of a high-frequency power amplifier changes an amplitude of a high-frequency phase modulation signal according to a base band amplitude modulation signal and a gain control signal. A variable gain amplifier changes the amplitude of the high-frequency phase modulation signal according to the base band amplitude modulation signal and the gain control signal, so that the base band amplitude modulation signal is supplied to an amplifier via a linear-log converter.

4 Claims, 7 Drawing Sheets

U.S. PATENT DOCUMENTS

| | | | |
|---|---|---|---|
| 7,129,778 B2 * | 10/2006 | Robinson | 330/151 |
| 2002/0177420 A1 | 11/2002 | Sander et al. | |
| 2003/0160658 A1 | 8/2003 | Cioffi et al. | |
| 2003/0215026 A1 * | 11/2003 | Hietala | 375/297 |
| 2004/0151257 A1 * | 8/2004 | Staszewski et al. | 375/296 |

FOREIGN PATENT DOCUMENTS

| | | |
|---|---|---|
| JP | 8-070331 | 3/1996 |
| JP | 2001-156554 | 6/2001 |
| JP | 3207153 | 7/2001 |

* cited by examiner

TRANSMISSION DEVICE AND RADIO COMMUNICATION DEVICE

TECHNICAL FIELD

The present invention relates to a transmission apparatus and a radio communication apparatus, particularly, using a polar modulation scheme

BACKGROUND ART

Conventionally, as a high frequency power amplifier that amplifies a modulation signal including envelope fluctuation components, class-A or class-AB linear amplifiers have been used to amplify envelope fluctuation components in linear. Such a linear amplifier excels in linearity, however always consumes power accompanied with direct current bias components, and therefore power efficiency is low as compared with a nonlinear amplifier such as class-C and class-E. Therefore, when such a high frequency power amplifier is applied to a portable radio apparatus in which power is supplied by batteries, since the power consumption of the high frequency power amplifier is large, operating time becomes short. Furthermore, when such a high frequency power amplifier is applied to a base station apparatus of a radio system in which a plurality of large power transmission apparatuses are located, the apparatus becomes large and calorific power increases.

Consequently, as a high efficiency transmission apparatus, a transmission apparatus using a polar modulation scheme is proposed. As shown in FIG. 1, the transmission apparatus using a polar modulation scheme has amplitude phase separation section 10, amplitude modulation signal amplifier 11, frequency synthesizer 12, and high frequency power amplifier 13 which is a nonlinear amplifier.

Amplitude phase separation section 10 receives baseband modulation signal S1 and separates this signal into baseband amplitude modulation signal S2 and baseband phase modulation signal S3. Baseband amplitude modulation signal S2 is supplied to nonlinear high frequency power amplifier 13 via amplitude modulation signal amplifier 11 as a supply voltage of high frequency power amplifier 13. Baseband phase modulation signal S3 is inputted to frequency synthesizer 12. Frequency synthesizer 12 phase modulates a carrier signal with baseband phase modulation signal S3 and thereby obtains high frequency phase modulation signal S4 and transmits this signal to high frequency power amplifier 13. By this means, high frequency power amplifier 13 amplifies high frequency phase modulation signal S4 at the supply voltage according to baseband amplitude modulation signal S2 and outputs the result as transmission output signal S5.

Next, the operation of the transmission apparatus using a polar modulation scheme will be described. First, if baseband modulation signal S1 is Si(t), Si(t) can be expressed in the next equation.

[Equation 1]

$$Si(t) = a(t)\exp[j\phi(t)] \quad (1)$$

Here, a(t) is amplitude data, and $\exp[j\phi(t)]$ is phase data.

Amplitude phase separation section 10 extracts amplitude data a(t) and phase data $\exp[j\phi(t)]$ from Si(t). Here, amplitude data a(t) corresponds to baseband amplitude modulation signal S2, and phase data $\exp[j\phi(t)]$ corresponds to baseband phase modulation signal S3. Amplitude data a(t) is amplified at amplitude modulation signal amplifier 11 and provided to high frequency power amplifier 13. By this means, the supply voltage value of high frequency power amplifier 13 is set based on amplitude data a(t).

Frequency synthesizer 12 generates high frequency phase modulation signal S4 in which carrier angular frequency ωc is modulated at phase data $\exp[j\phi(t)]$, and the result is inputted to high frequency power amplifier 13. Here, if high frequency phase modulation signal S4 is Sc, Sc can be expressed in the next equation.

[Equation 2]

$$Sc = \exp j[\omega c \times t + \phi(t)] \quad (2)$$

Then, by using a nonlinear amplifier as high frequency power amplifier 13, transmission output signal S5, in which a signal that multiplied supply voltage value a(t) of high frequency power amplifier 13 and an output signal of frequency synthesizer 12 together is amplified by gain G of high frequency power amplifier 13, can be obtained. Here, suppose transmission output signal S5 is RF signal Srf, RF signal Srf can be expressed in the next equation.

[Equation 3]

$$Srf = Ga(t)Sc = Ga(t)\exp j[\omega c \times t + \phi(t)] \quad (3)$$

A signal inputted to high frequency power amplifier 13 is a phase modulation signal which does not have fluctuation components directed to amplitude and therefore is a constant envelope signal. Consequently, it is possible to use a nonlinear amplifier which is efficient as high frequency power amplifier 13, so that a transmission apparatus with high efficiency can be provided. This kind of technology using polar modulation is disclosed in, for example, Patent Document 1 and Patent Document 2.

Patent Document 1: Japanese Patent Publication Laid-Open No. 3207153

Patent Document 2: Japanese Patent Application Laid-Open No. 2001-156554

DISCLOSURE OF INVENTION

Problems to be Solved by the Invention

However, when the conventional transmission apparatus using a polar modulation scheme controls output power of high frequency power amplifier 13, since high frequency power amplifier 13 is a nonlinear amplifier, the output signal does not change linearly for the input signal. Therefore, it is necessary to control the average signal level by a transmission power control signal (hereinafter, referred to as a gain control signal) by changing a supply voltage in the same way as instantaneous amplitude control by a baseband amplitude modulation signal. In this case, the output power control range is limited by transistor operation limit for the leakage power or the supply voltage.

It is therefore an object of the present invention to provide a transmission apparatus with high power efficiency and the wide transmission output power control range.

Means for Solving the Problem

In order to solve the above problems, one aspect of the transmission apparatus of the present invention employs a configuration of a transmission apparatus using a polar modulation scheme, and this transmission apparatus has: an amplitude phase separation section that separates baseband modulation data into a baseband amplitude modulation signal and a baseband phase modulation signal; a phase modulation section that modulates a high frequency carrier signal based on the baseband phase modulation signal and forms a high frequency phase modulation signal; a variable gain amplifier that is provided in a later stage of the phase modulation section and amplifies the high frequency phase modulation signal; and a high frequency power amplifier that is provided in a later stage of the variable gain amplifier and amplifies power of the high frequency phase modulation signal amplified by the variable gain amplifier, wherein the variable gain amplifier has a linear-log conversion circuit that linear-log converts the baseband amplitude modulation signal, and an amplifier that amplifies the high frequency phase modulation signal based on the linear-log converted baseband modulation signal and a gain control signal.

According to this configuration, since the variable gain amplifier is provided, as compared with the case where all amplification processing of the high frequency phase modulation signal is performed by the high frequency power amplifier, it is possible to perform amplification processing taking into account performance of the high frequency power amplifier and obtain transmission output power with wide dynamic range by combining amplification processing of the high frequency power amplifier and the variable gain amplifier. That is, by controlling a gain of the variable gain amplifier and thereby controlling the level of the high frequency phase modulation signal inputted by the high frequency power amplifier, it is possible to reduce the leakage power. As a result, with the high frequency power amplifier, it is possible to extend the output power control range by the supply voltage.

In addition, the variable gain amplifier has a linear-log conversion circuit that linear-log converts a baseband amplitude modulation signal and an amplifier that amplifies a high frequency phase modulation signal based on the linear-log converted baseband amplitude modulation signal and a gain control signal so that the amplifier can perform both average signal level control by the gain control signal and instantaneous amplitude control based on the baseband amplitude modulation signal on the high frequency phase modulation signal, and it is possible to simplify the configuration on a signal line for amplifying the high frequency phase modulation signal. With a simple configuration in which, for example, a plurality of stages of amplifiers are provided or the same amplifier is shared, it is possible to apply both average signal level control based on the gain control signal and instantaneous amplitude fluctuation control based on the baseband amplitude modulation signal to the high frequency phase modulation signal.

Another aspect of the transmission apparatus of the present invention adopts a configuration wherein the variable gain amplifier further has an adder circuit that adds the baseband amplitude modulation signal linear-log converted by the linear-log conversion circuit and the gain control signal, and the amplifier amplifies the high frequency phase modulation signal based on the signal added by the adder circuit.

According to this configuration, since average signal level control and instantaneous amplitude control can be performed by the same amplifier, it is possible to correspondingly reduce the number of stages of amplifiers and thereby reduce the circuit scale.

Another aspect of the transmission apparatus of the present invention adopts a configuration further having a supply voltage supplying section that selectively supplies a supply voltage according to the baseband amplitude modulation signal and the gain control signal or a predetermined fixed supply voltage to the high frequency power amplifier according to first and second operation modes, wherein, in the first operation mode, the supply voltage changed according to the baseband amplitude modulation signal and the gain control signal is supplied to the high frequency power amplifier so that the high frequency power amplifier operates as a nonlinear amplifier, and thereby amplitude modulation is performed by the high frequency power amplifier according to the baseband amplitude modulation signal and the gain control signal. In the second operation mode, the fixed supply voltage is supplied to the high frequency power amplifier so that the high frequency power amplifier operates as a linear amplifier, and amplitude modulation is performed by the variable gain amplification section according to the baseband amplitude modulation signal and the gain control signal.

According to this configuration, in the first operation mode (for example, in the case of obtaining high level transmission output power), by operating the high frequency power amplifier as a nonlinear amplifier, it is possible to significantly improve power efficiency. Furthermore, in the second operation mode (for example, in the case of obtaining low level transmission output power), the high frequency power amplifier is made to operate as a linear amplifier, and amplitude control by the baseband amplitude modulation signal and the gain control signal is performed at the variable gain amplifier. As a result, it is possible to maintain high power efficiency of the high frequency power amplifier and well perform average signal level control by the gain control signal and instantaneous amplitude control by the baseband modulation signal on the high frequency phase modulation signal over a wide range.

Another aspect of the radio communication apparatus of the present invention adopts a configuration having a transmission processing section that has one of the above transmission apparatuses, a reception processing section that demodulates a received signal, an antenna, a transmission/reception switching section that switches between supplying a transmission signal from the transmission processing section to the antenna and supplying the received signal from the antenna to the reception processing section.

According to this configuration, since the transmission apparatus has high power efficiency, operating time of the mounted batteries can be extended and a high frequency power amplifier of the transmission apparatus can be made small, and therefore, it is possible to achieve further miniaturizing of a radio communication apparatus. Furthermore, since the transmission output power control range of the transmission apparatus is large, it is possible to form a higher quality transmission signal according to the communication environment and improve communication quality.

Advantageous Effect of the Invention

In this way, according to the present invention, it is possible to realize a transmission apparatus and a radio communication apparatus with high power efficiency and wide transmission output power control range.

BEST MODE FOR CARRYING OUT THE INVENTION

Embodiments of the present invention will be described below in detail with reference to the accompanying drawings.

Embodiment 1

Figure 1:
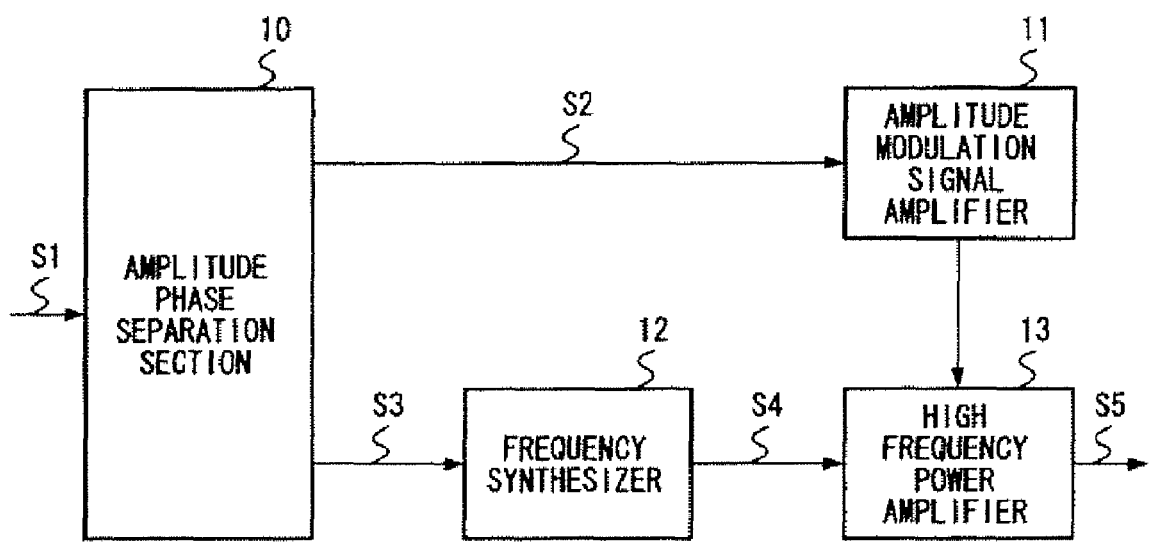
FIG. 1 is a block diagram showing a configuration example of the conventional transmission apparatus.
Figure 2:
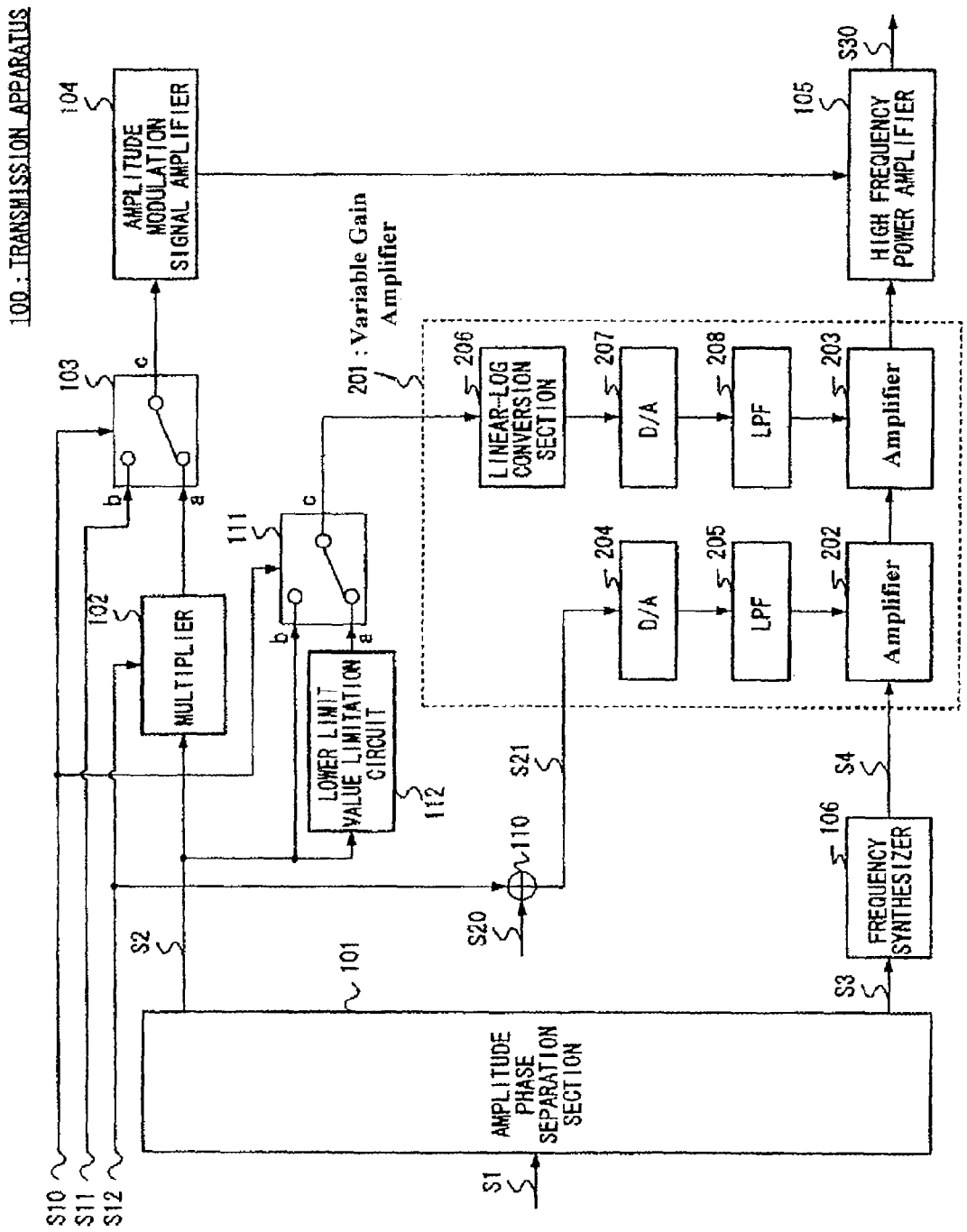
FIG. 2 is a block diagram showing a schematic configuration of the transmission apparatus according to Embodiment 1 of the present invention.

FIG. 2 is a block diagram showing a schematic configuration of the transmission apparatus for describing embodiments of the present invention. Transmission apparatus 100 transmits baseband modulation signal S1 using a polar modulation scheme.

Transmission apparatus 100 inputs baseband modulation signal S1 to amplitude phase separation section 101. Amplitude phase separation section 101 separates baseband modulation signal S1 into baseband amplitude modulation signal S2 and baseband phase modulation signal S3.

Baseband amplitude modulation signal S2 is inputted to multiplier 102. Multiplier 102 multiplies baseband amplitude modulation signal S2 and gain control signal S12 and transmits the multiplication result to terminal a of switch 103. Furthermore, direct current voltage value S11 is provided to terminal b of switch 103, and switch 103 outputs gain multiplied baseband amplitude modulation signal S2 or direct current voltage value S11 to the subsequent amplitude modulation signal amplifier 104 according to mode switching signal S10. Amplitude modulation signal amplifier 104 generates a supply voltage of high frequency power amplifier 105 from the signal inputted from switch 103 and supplies this supply voltage to high frequency power amplifier 105. Here, in order that amplitude modulation signal amplifier 104 may efficiently change the supply voltage according to the level of baseband amplitude modulation signal S2, it is preferable to use a class-D amplifier indicating amplitude information by pulse width.

By this means, transmission apparatus 100 can select between supplying the supply voltage based on gain controlled baseband modulation signal S2 and supplying the fixed supply voltage based on direct current value S11 to high frequency power amplifier 105 according to mode switching signal S10. That is, it is possible to select between making high frequency power amplifier 105 perform nonlinear operation and linear operation according to mode switching signal S10. In other words, switch 103 functions as a supply voltage supplying section that selectively supplies the supply voltage according to baseband amplitude modulation signal S2 or a predetermined fixed supply voltage to high frequency power amplifier 105.

On the other hand, baseband phase modulation signal S3 is first inputted to frequency synthesizer 106. Frequency synthesizer 106 obtains high frequency phase modulation signal S4 by phase modulating carrier frequency at baseband phase modulation signal S3 and transmits this signal to variable gain amplifier 201.

Variable gain amplifier 201 has two amplifiers 202 and 203, linear-log conversion section 206, digital-analog conversion circuits (D/A) 204 and 207, and low-pass filters (LPF) 205 and 208.

Variable gain amplifier 201 inputs baseband amplitude modulation signal S2 outputted from switch 111 to linear-log conversion section 206. Linear-log conversion section 206 log-converts baseband amplitude modulation signal S2 and outputs the result. The manner of this linear-log conversion is not described in detail, but can be readily implemented by a known digital signal processing circuit. The log converted baseband amplitude modulation signal is inputted to amplifier 203 as a gain control signal of amplifier 203 via digital-analog conversion circuit (D/A) 207 and low-pass filter (LPF) 208.

Furthermore, variable gain amplifier 201 provides gain control signal S21 to amplifier 202 as a gain control signal of amplifier 202 via digital-analog conversion circuit (D/A) 204 and low-pass filter (LPF) 205.

Gain control signal S21 is a signal in which an offset corresponding to gain offset signal S20 is added to gain control signal S12 by adder 110. This gain offset signal S20 is set to amplifier 202 so that a signal of the level suitable for making high frequency power amplifier 105 operate as a nonlinear amplifier in saturation operation or switching operation area, can be obtained. Amplifier 202 amplifies high frequency phase modulation signal S4 according to gain control signal S21 and transmits the amplified signal to amplifier 203.

Either baseband amplitude modulation signal S2 or baseband amplitude modulation signal S2 in which a lower limit value is limited by lower limit value limitation circuit 112, is inputted to linear-log conversion section 206 via switch 111. In addition, lower limit value limitation circuit 112 limits a lower limit value for amplitude fluctuation of baseband amplitude modulation signal S2. By this means, amplifier 203 performs amplitude modulation on the output signal of amplifier 202 based on either baseband amplitude modulation signal S2 in which a lower limit value is limited or baseband amplitude modulation signal S2 in which a lower limit value is not limited, and transmits the result to high frequency power amplifier 105.

High frequency power amplifier 105 amplifies the high frequency phase modulation signal outputted from variable gain amplifier 201 using the supply voltage value supplied from amplitude modulation signal amplifier 104 and obtains transmission output signal S30.

Next, the operation of transmission apparatus 100 will be described. In FIG. 2, the operation mode of high frequency power amplifier 105 is determined, for example, according to transmission power level specification from a radio base station to transmission apparatus 100 or transmission power level based on the state of the received signal of transmission apparatus 100.

To increase the level of transmission output signal S30, the operation mode in which high frequency power amplifier 105 operates as a nonlinear amplifier is preferable, from the viewpoint of power efficiency. On the other hand, when the level of transmission output signal S30 decreases and high frequency power amplifier 105 goes outside the operable range as a nonlinear amplifier, it is preferable to operate high frequency power amplifier 105 as a nonlinear amplifier.

With focus on this point, transmission apparatus 100 is provided with mode switching signal S10 and switches the operation mode of high frequency power amplifier 105 between the mode for operating as a nonlinear amplifier and the mode for operating as a linear amplifier. Mode switching signal S10 is set based on the desired transmission power level and characteristics of high frequency power amplifier 105.

In addition, mode switching signal S10, direct current voltage value S11, gain control signal S12 and gain offset signal S20 inputted to transmission apparatus 100 are set, for example, by a control section (not shown).

The connection of switches 103 and 111 shown in FIG. 2 shows the case where the level of transmission output signal S30 is relatively large. First, the case where the level of transmission output signal S30 is relatively large will be described. In this case, high frequency power amplifier 105 operates as a nonlinear amplifier in the saturation operation or switching operation area. In this case, amplitude modulation of the high frequency phase modulation signal is performed at high frequency power amplifier 105. Specifically, terminal a and terminal c of switch 103 are connected by mode switching signal S10, and thereby a multiplication value of baseband amplitude modulation signal S2 outputted from terminal c of switch 103 and gain control signal S12 is amplified at amplitude modulation signal amplifier 104 and then applied to high frequency power amplifier 105 as a supply voltage of high frequency power amplifier 105. As a result, high frequency power amplifier 105 performs amplitude modulation operation.

On the other hand, as for high frequency phase modulation signal S4, when the level of transmission output signal S30 is relatively large, terminal a and terminal c of switch 111 are connected by mode switching signal S10. As a result, a signal in which the amplitude fluctuation lower limit value of baseband amplitude modulation signal S2 is limited by lower limit value limitation circuit 112, is inputted to linear-log conversion section 206 of variable gain amplifier 201 via switch 111. By this means, the output signal of amplifier 202 is amplitude modulated at amplifier 203 based on baseband amplitude modulation signal S2 in which a lower limit value is limited, and transmitted to high frequency power amplifier 105.

Here, generally, voltage gain $V_{out}/V_{IN}$ between input and output of a variable gain amplifier is an exponential function of a gain control signal. Taking this into consideration, in this embodiment, by log converting baseband amplitude modulation signal S2 at linear-log conversion section 206 and supplying the result as a gain control signal of amplifier 203, amplifier 203 is adapted to implement linear operation for baseband amplitude modulation signal S2. In other words, by providing linear-log conversion section 206, it is possible to implement multiplication of high frequency phase modulation signal S4 and baseband amplitude modulation signal S2 using gain amplifier 203.

In this way, by performing multiplication by amplifier 203 with baseband amplitude modulation signal S2 as a gain, it is possible to perform average signal level control by gain control signal S12 and instantaneous amplitude control by baseband amplitude modulation signal S2 using a variable gain amplifier of the same configuration. By this means, amplifiers can be readily manufactured.

Furthermore, the variable gain amplifier of the present invention, actually, is not simply divided into two blocks as shown in FIG. 2, and, for example, two out of three dependently connected variable gain amplifiers are used as amplifier 202 for controlling the average signal level, and the other one is used as amplifier 203 for performing instantaneous amplitude control. In this case, as described in this embodiment, if average signal level control and instantaneous amplitude control can be performed on the similar variable gain amplifier, it is possible to readily change the number of variable gain amplifiers assigned for each control according to specifications. This increases the versatility and improves the usability.

Figure 3:
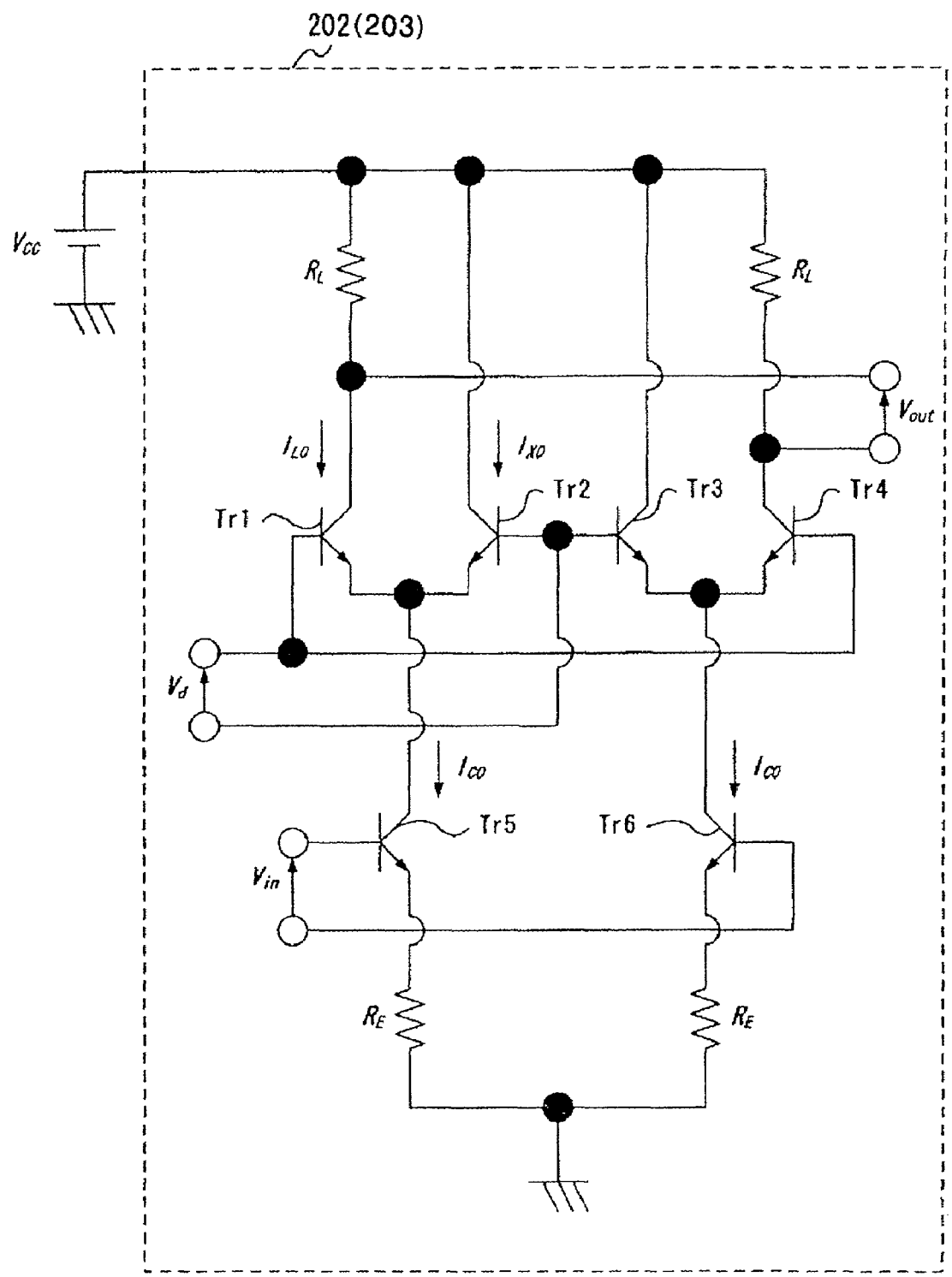
FIG. 3 is a connection diagram showing a configuration example of the variable gain amplifier.

FIG. 3 shows the configuration example of the variable gain amplifier. In the view, $V_{in}$ is a differential input signal, $V_{out}$ is a differential output signal, $V_d$ is a (differential) gain control signal, and $V_{cc}$ is a supply voltage. $R_E$ is an emitter resistance, and $R_L$ is a load resistance. Transistors TR5 and TR6 connected to an input terminal to which differential input signal $V_{in}$ is inputted are emitter-grounded, and differential currents $G_m \cdot V_{in}$ flow through the collector. Here, $G_m$ can be expressed in the next equation.

[Equation 4]

$$G_m = \frac{1}{\frac{V_T}{I_{C0}} + R_E} \tag{4}$$

Furthermore, the current is divided according to $V_d$ by transistors Tr1, Tr2, Tr3 and Tr4 connected to an input terminal to which gain control signal $V_d$ is inputted, and voltage drop occurs at load resistance $R_L$. As a result, the relationship between input and output can be expressed in the next equation.

[Equation 5]

$$\frac{v_{out}}{v_{in}} = \frac{R_L}{\frac{V_T}{I_{C0}} + R_E} \cdot \frac{1}{1 + \exp\left(-\frac{v_d}{V_T}\right)} \tag{5}$$

When $V_d = -\infty$, all current flows to the side to which load resistance $R_L$ is not connected ($I_{xo}$ side), and therefore the next equation applies.

[Equation 6]

$$\frac{v_{out}}{v_{in}} = 0 \tag{6}$$

Inversely, when $V_d = +\infty$, all current flows to the side to which load resistance $R_L$ is connected, and therefore the next equation applies.

[Equation 7]

$$\frac{v_{out}}{v_{in}} = \frac{R_L}{\frac{V_T}{I_{C0}} + R_E} \tag{7}$$

Furthermore, when $V_d/V_T << -1$ (input is small enough), approximation as expressed in the next equation applies.

[Equation 8]

$$\frac{v_{out}}{v_{in}} \cong \frac{R_L}{\frac{V_T}{I_{C0}} + R_E} \cdot \exp\left(\frac{v_d}{V_T}\right) \tag{8}$$

That is, voltage gain $V_{out}/V_{in}$ (proportional to output amplitude) between input and output is an exponential function of gain control signal (or amplitude control signal) $V_d$ (log linear).

In this embodiment, linear-log conversion section 206 performs log conversion, and then amplifier 203 multiplies an exponent. Therefore, the output becomes linear as a result. When an inverse function of equation (5) is applied to the linear-log conversion performed at linear-log conversion section 206, amplifier 203 can perform accurate linear amplification. Furthermore, when input is small enough, if an inverse function of the approximation of equation (8) is applied to the linear-log conversion performed at linear-log conversion section 206, there is practically no problem.

Incidentally, the inverse function of equation (5) is expressed in the next equation.

[Equation 9]

$$v_d = -V_T \cdot \log_e\left(\frac{R_L}{\frac{V_T}{I_{C0}} + R_E} \cdot \frac{1}{A} - 1\right) \tag{9}$$

Here, A is an amplitude signal.

Furthermore, the inverse function of equation (8) is expressed in the next equation.

[Equation 10]

$$v_d = V_T \cdot \log_e\left(\frac{\frac{V_T}{I_{C0}} + R_E}{R_L} \cdot A\right) \tag{10}$$

In this way, according to this embodiment, by providing linear-log conversion section 206 and amplifier 203, log-converting baseband amplitude modulation signal S2 and setting the log-converted signal as a gain control signal of amplifier 203, it is possible to provide instantaneous amplitude fluctuation by baseband amplitude modulation signal S2 at amplifier 203. As a result, both average signal level control by gain control signal S12 and instantaneous amplitude fluctuation control by baseband amplitude modulation signal S2 can be performed on high frequency phase modulation signal S4 at a variable gain amplifier so that it is possible to simplify the configuration on a signal line for amplifying high frequency phase modulation signal S4, and also increase the versatility and improve the usability.

Furthermore, since the linear-log converted value is digital-analog converted and provided to amplifier 203, compared to the case of digital-analog converting an antilogarithm, the number of bits required at D/A 207 is reduced. As a result, it is possible to simplify the configuration of D/A 207 and reduce the processing time.

Still further, in this embodiment, variable gain amplifier 201 is provided in the anterior stage of high frequency power amplifier 105. In the first operation mode, a supply voltage changed according to baseband amplitude modulation signal S2 and gain control signal S12 is supplied to high frequency power amplifier 105 so that high frequency power amplifier 105 operates as a nonlinear amplifier, and thereby amplitude modulation according to baseband amplitude modulation signal S2 and gain control signal S12 is performed by high frequency power amplifier 105. In the second operation mode, a fixed supply voltage is supplied to high frequency power amplifier 105 so that high frequency power amplifier 105 operates as a linear amplifier, and thereby amplitude modulation according to baseband amplitude modulation signal S2 and gain control signal S12 is performed by variable gain amplification section 201. It is thereby possible to maintain high power efficiency of high frequency power amplifier 105 and implement efficient average signal level control by gain control signal S12 and efficient instantaneous amplitude control by baseband amplitude modulation signal S2 on high frequency phase modulation signal S4 over a wide range.

Description will given in detail below.

Figure 4:
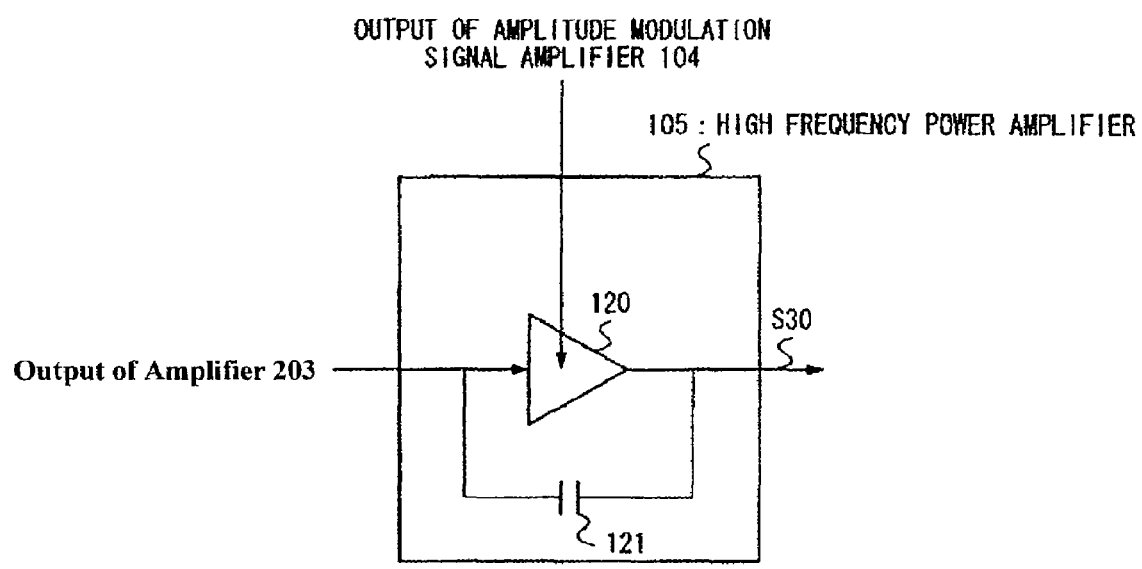
FIG. 4 is a diagram showing a circuit configuration in the case of using the high frequency power amplifier shown in FIG. 1 as a nonlinear amplifier.
Figure 5:
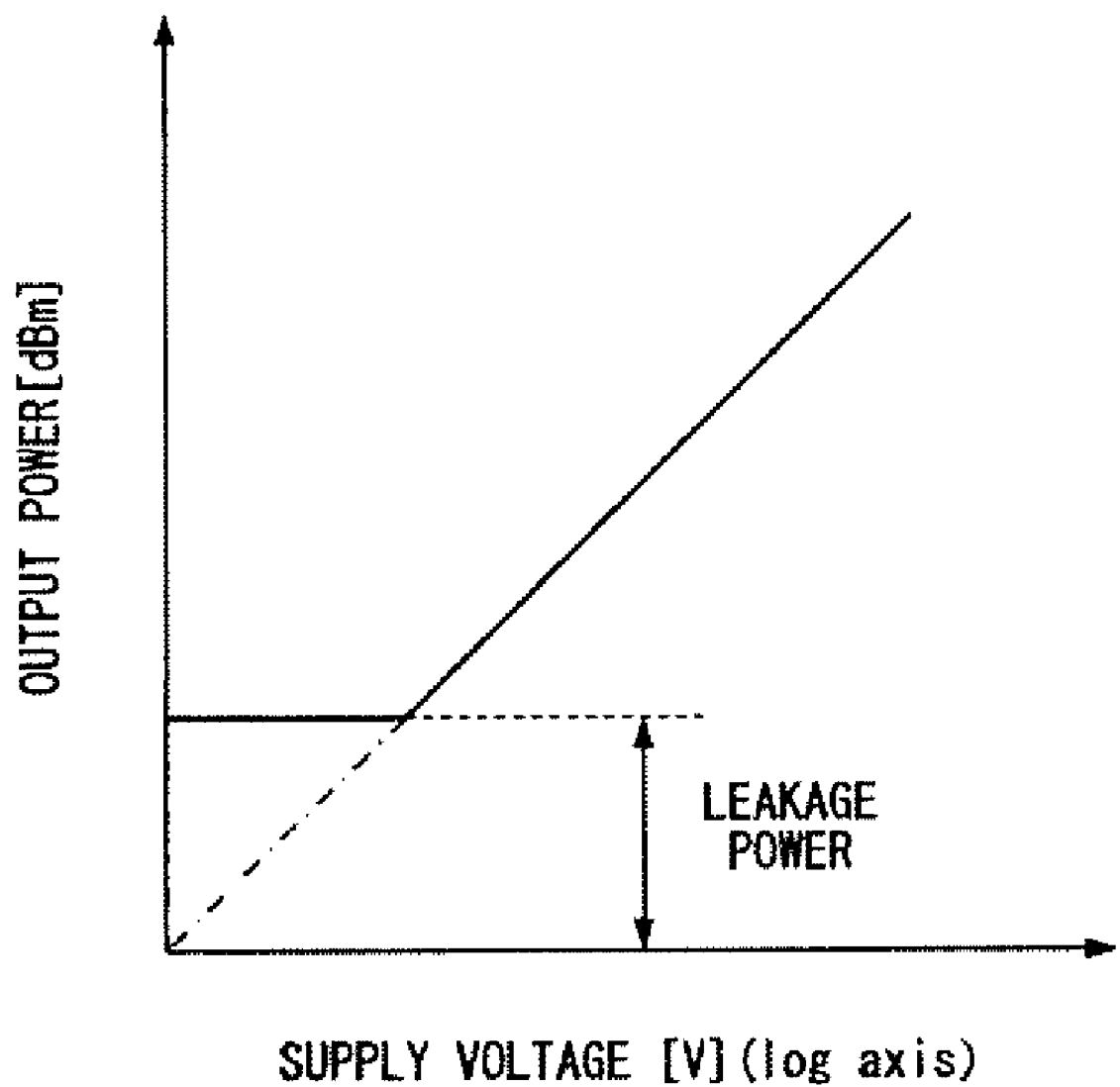
FIG. 5 illustrates the operation in the case of using the high frequency power amplifier shown in FIG. 1 as a nonlinear amplifier.

FIG. 4 is a diagram showing a circuit configuration of high frequency power amplifier 105 when used as a nonlinear amplifier, and FIG. 5 illustrates the operation of high frequency power amplifier 105 when used as a nonlinear amplifier. As shown in FIG. 4, high frequency power amplifier 105 can be indicated by nonlinear amplifier 120 and parasitic capacity 121 connected between the input side and the output side of nonlinear amplifier 120.

FIG. 5 shows the relationship between a supply voltage and an output voltage of nonlinear amplifier 120. As shown in FIG. 5, at nonlinear amplifier 120, the square of a supply voltage is proportional to the output voltage. Here, the amount of leakage power is determined by parasitic capacity 121 and the input signal level of nonlinear amplifier 120 (the output signal level of variable gain amplifier 201).

Here, in the case of not providing variable gain amplifier 201, since the output of frequency synthesizer 106 is substantially constant, the leakage power is also constant. In that case, in order to reduce the level of transmission output signal S30, the supply voltage of nonlinear amplifier 120 is reduced, but the reduction is restricted by the leakage power, and the output level cannot be reduced more than a fixed value.

On the other hand, in this embodiment, by controlling the gain of amplifier 202 by gain control signal S12 and controlling the level of a high frequency phase modulation signal to be inputted to high frequency power amplifier 105, it is possible to reduce the leakage power. Therefore, at high frequency power amplifier 105, it is possible to extend the output power control range by the supply voltage.

Furthermore, amplifier 203 performs amplitude modulation on the output signal of amplifier 202 based on baseband amplitude modulation signal S2, and thereby the input level of high frequency power amplifier 105 follows instantaneous level fluctuation of baseband amplitude modulation signal S2 and the leakage power is reduced so that it is possible to improve reproducibility of instantaneous level fluctuation. That is, input of high frequency power amplifier 105 can be controlled according to instantaneous output power.

Here, if the input level of high frequency power amplifier 105 is reduced too much, high frequency amplifier 105 goes outside the saturation operation or switching operation area, and linearity for supply voltage change is deteriorated. In this embodiment, by providing lower limit value limitation circuit 112, the input level of high frequency power amplifier 105 is maintained above a constant value.

Next, the case where the level of transmission output signal S30 is relatively small will be described. First, at switch 103, terminal b and terminal c are connected by mode switching signal S10. By this means, direct current voltage value S11 is inputted to amplitude modulation signal amplifier 104 via switch 103, and a fixed supply voltage is applied from amplitude modulation signal amplifier 104 to high frequency power amplifier 105. As a result, high frequency power amplifier 105 operates as a linear amplifier in which the relationship between input and output is linear.

On the other hand, as for high frequency phase modulation signal S4, when the level of transmission output signal S30 is relatively small, terminal b and terminal c of switch 111 are connected by mode switching signal S10, baseband amplitude modulation signal S2 in which a lower limit value is not limited is inputted to linear-log conversion section 206, amplitude modulation is performed on the output signal of amplifier 202 at amplifier 203 based on this baseband amplitude modulation signal S2, and the result is outputted to high frequency power amplifier 105.

Furthermore, when the level of transmission output signal S30 is relatively small, gain offset signal S20 is set at zero, and gain control signal S21 without an offset is inputted to amplifier 202. High frequency power amplifier 105 linear-amplifies output of amplifier 203 under the fixed supply voltage supplied from amplitude modulation signal amplifier 104 and obtains transmission output signal S30.

In this way, with transmission apparatus 100 of this embodiment, when the level of transmission output signal S30 is small and high frequency power amplifier 105 may go outside the saturation operation or switching operation area, that is, when output power linearity for supply voltage change may be deteriorated, by operating high frequency power amplifier 105 as a linear amplifier, it is possible to maintain output signal linearity for the input signal and extend the output power control range.

That is, when the level of transmission output signal S30 is relatively large, high frequency power amplifier 105 is used as a nonlinear amplifier, and instantaneous amplitude control based on baseband amplitude modulation signal S2 and average output level control based on gain control signal S12 are performed at the supply voltage applied to high frequency power amplifier 105. When the level of transmission output signal S30 is relatively small, high frequency power amplifier 105 is used as a linear amplifier, and instantaneous amplitude control and average output level control are performed at variable gain amplifier 201 provided in the anterior stage of high frequency power amplifier 105. By this means, it is possible to control the level of transmission output signal S30 over a wide range.

Furthermore, when high frequency power amplifier 105 performs nonlinear operation, by controlling a gain of amplifier 202 according to gain control signal S12 and varying the level of high frequency phase modulation signal S4, it is possible to reduce the leakage power at high frequency power amplifier 105 and consequently extend the output power control range by the supply voltage.

Embodiment 2

A case has been described above with Embodiment 1 where the case has been described where only instantaneous amplitude fluctuation by baseband amplitude modulation signal S2 is provided by amplifier 203, but with this embodiment, average signal level control in addition to instantaneous amplitude fluctuation control by baseband amplitude modulation signal S2 is performed at amplifier 203.

Figure 6:
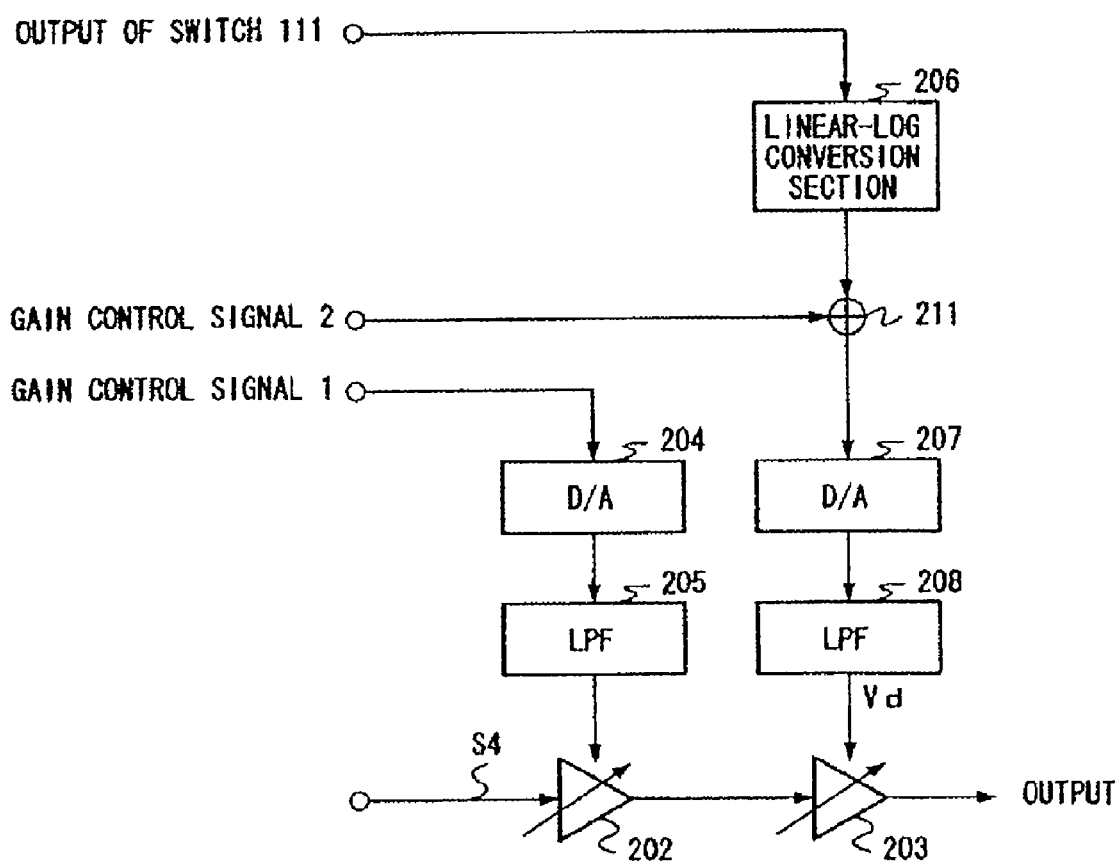
FIG. 6 is a block diagram showing a configuration of the variable gain amplification section of Embodiment 2.

FIG. 6 shows a configuration example to realize this. In FIG. 6, in which the same reference numerals are assigned to the parts corresponding to FIG. 2, variable gain amplifier 210 adds a log-converted baseband amplitude modulation signal and gain control signal 2 at adder 211. By this means, at amplifier 203, it is possible to provide instantaneous amplitude fluctuation by baseband amplitude modulation signal S2 and average signal level fluctuation by gain control signal 2. Then, average signal level control is assigned to amplifier 202 and amplifier 203 so that it is possible to reduce the number of stages of amplifier 202 and thereby reduce the circuit scale. Furthermore, even in the case where the performance of variable gain amplifiers is limited for a gain control signal, it is possible to perform amplification processing with sufficiently wide dynamic range according to the gain control signal.

Still further, in FIG. 6, average signal level control according to gain control signal 1 is performed at amplifier 202, but, in some cases, instantaneous amplitude control and average signal level control can be performed by amplifier 203 alone, and therefore it is possible to further reduce the circuit scale.

Furthermore, in Embodiment 1 and this embodiment, a case has been described where linear-log conversion is performed before digital-analog conversion by D/A 207, but the linear-log conversion may be performed after the digital-analog conversion.

Embodiment 3

Figure 7:
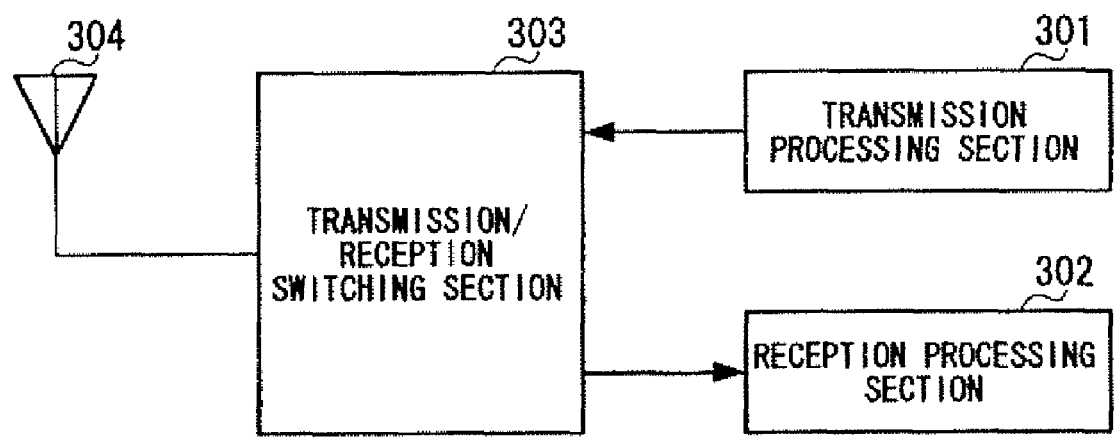
FIG. 7 is a block diagram showing a configuration of the radio communication apparatus provided with the transmission apparatus of the present invention.

FIG. 7 shows the configuration of a radio communication apparatus applying the transmission apparatus of the above-described Embodiments 1 and 2. Radio communication apparatus 300 has transmission processing section 301 provided with the transmission apparatus of Embodiments 1 and 2, reception processing section 302 that performs reception processing including demodulation processing on a received signal, antenna 304, and transmission/reception switching section 303 that switches between the state of supplying a transmission signal from transmission processing section 301 to antenna 304 and the state of supplying the received signal from antenna 304 to reception processing section 302.

Radio communication apparatus 300 is, for example, a mobile telephone, a mobile radio terminal apparatus such as a mobile information terminal provided with a communication function, or a radio base station or the like.

By applying transmission apparatus 100 described in embodiments 1 and 2 to transmission processing apparatus 301, when radio communication apparatus 300 is a mobile radio terminal apparatus, high frequency power amplifier 104 operates as a nonlinear amplifier at the time of high output power, thereby making it possible to improve power efficiency and prevent battery consumption correspondingly and extend operating time. Furthermore, it is possible to miniaturize high frequency power amplifier 105 in accordance with improvement of power efficiency and also reduce calorific power so that a mobile radio terminal apparatus having high frequency power amplifier 105 can be miniaturized.

Furthermore, when radio communication apparatus 300 is a base station apparatus for a radio system in which a plurality of large power transmission apparatuses are provided, since power efficiency of high frequency power amplifier 105 at the time of high output power improves, it is possible to miniaturize high frequency power amplifier 105 and reduce calorific power, and, as a result, prevent facilities from becoming large and improve space efficiency.

In addition, the present invention is not limited to the above embodiments, and without going beyond the scope of the gist, can be implemented with other embodiments in specific configurations, functions, operations and effects.

INDUSTRIAL APPLICABILITY

The transmission apparatus and radio communication apparatus of the present invention have high power efficiency and can realize a transmission apparatus of a wide transmission output power control range, and is suitable for application to a radio communication apparatus such as a mobile information terminal or a radio base station.

The invention claimed is:

1. A transmission apparatus using a polar modulation scheme, comprising:
   an amplitude phase separator that separates baseband modulation data into a baseband amplitude modulation signal and a baseband phase modulation signal;
   a phase modulator that modulates a high frequency carrier signal based on the baseband phase modulation signal and forms a high frequency phase modulation signal;
   a variable gain amplifier that is provided in a later stage of said phase modulator and amplifies the high frequency phase modulation signal; and
   a high frequency power amplifier that is provided in a later stage of said variable gain amplifier and amplifies power of the high frequency phase modulation signal amplified by said variable gain amplifier,
   wherein said variable gain amplifier comprises:
   a linear-log converter that linear-log converts the baseband amplitude modulation signal; and
   an amplifier that amplifies the high frequency phase modulation signal based on the linear-log converted baseband amplitude modulation signal and a gain control signal.

2. The transmission apparatus according to claim 1, wherein:
   said variable gain amplifier further comprises an adder that adds the baseband amplitude modulation signal linear-log converted by said linear-log converter and the gain control signal; and
   said amplifier amplifies the high frequency phase modulation signal based on the signal added by said adder.

3. The transmission apparatus according to claim 1, further comprising a supply voltage supplying section that selectively supplies a supply voltage according to the baseband amplitude modulation signal and the gain control signal or a predetermined fixed supply voltage to said high frequency power amplifier according to first and second operation modes, wherein:
   in the first operation mode, the supply voltage changed according to the baseband amplitude modulation signal and the gain control signal is supplied to said high frequency power amplifier so that said high frequency power amplifier operates as a nonlinear amplifier, and amplitude modulation is performed by said high frequency power amplifier according to the baseband amplitude modulation signal and the gain control signal; and
   in the second operation mode, the fixed supply voltage is supplied to said high frequency power amplifier so that said high frequency power amplifier operates as a linear amplifier, and amplitude modulation is performed by said variable gain amplification section according to the baseband amplitude modulation signal and the gain control signal.

4. A radio communication apparatus comprising:
   a transmission processing section that comprises the transmission apparatus according to claim 1;
   a reception processing section that demodulates a received signal;
   an antenna; and
   a transmission/reception switching section that switches between supplying a transmission signal from said transmission processing section to said antenna and supplying the received signal from said antenna to said reception processing section.

* * * * *